United States Patent [19]

Auerbach et al.

[11] Patent Number: 5,745,058
[45] Date of Patent: Apr. 28, 1998

[54] METHOD AND SYSTEM FOR COMPRESSING MICROCODE TO BE EXECUTED WITHIN A DATA PROCESSING SYSTEM

[75] Inventors: Daniel Jonathan Auerbach, San Jose, Calif.; David John Craft; Robert Kevin Montoye, both of Austin, Tex.

[73] Assignee: International Business Machines Corporation, Armonk, N.Y.

[21] Appl. No.: 734,211

[22] Filed: Oct. 21, 1996

[51] Int. Cl.$^6$ .................................................. H03M 7/00
[52] U.S. Cl. .................................................................. 341/51
[58] Field of Search ............................. 341/51, 67, 106, 341/107

[56] References Cited

U.S. PATENT DOCUMENTS

| | | | |
|---|---|---|---|
| 4,809,081 | 2/1989 | Linehan | 358/260 |
| 4,876,541 | 10/1989 | Storer | 341/51 |
| 5,146,560 | 9/1992 | Goldberg et al. | 395/200 |
| 5,231,484 | 7/1993 | Gonzales et al. | 358/133 |
| 5,250,949 | 10/1993 | Frost et al. | 341/200 |
| 5,394,534 | 2/1995 | Kulakowski et al. | 395/425 |
| 5,426,512 | 6/1995 | Watson | 358/426 |
| 5,430,465 | 7/1995 | Sabella et al. | 345/199 |
| 5,469,161 | 11/1995 | Bezek | 341/51 |
| 5,488,365 | 1/1996 | Seroussi et al. | 341/51 |

OTHER PUBLICATIONS

IBM Technical Disclosure Bulletin, vol. 38, No. 12—Dec. 1995 "Exact Random Access of Motion Picture Experts Group Files".
IBM Technical Disclosure Bulletin, vol. 35, No. 1A—Jun. 1992 "Universal QIC-122 CODEC With An Output Cache".
IBM Technical Disclosure Bulletin, vol. 36, No. 06B—Jun. 1993 "Cache–Type files".

*Primary Examiner*—Brian K. Young
*Attorney, Agent, or Firm*—Casimer K. Salys; Antony P. Ng; Andrew J. Dillon

[57] ABSTRACT

A method for compressing a set of microcode to be utilized within a data processing system is disclosed. In accordance with the method and system of the present invention, a set of compiled microcode is parsed into multiple microcode segments, wherein each of these microcode segments is of equal length. Each of the microcode segments is then individually compressed by utilizing a data-compression routine. Next, all of these compressed microcode segments are concatenated to yield a set of compressed executable microcode. Finally, the starting address for each of the compressed microcode segments is stored in an indexer. By so doing, the required memory for storing the compressed executable microcode is reduced.

10 Claims, 5 Drawing Sheets

METHOD AND SYSTEM FOR COMPRESSING MICROCODE TO BE EXECUTED WITHIN A DATA PROCESSING SYSTEM

RELATED PATENT APPLICATION

The present patent application is related to the subject matter of a copending application U.S. Ser. No. 08/711,516 filed Sep. 16, 1996, entitled "System and Method for Compressing Compiled Microcode to be Executed Within a Data Processing System" (IBM Docket No. AT9-96045), and assigned to the assignee herein named.

BACKGROUND OF THE INVENTION

1. Technical Field

The present invention relates to an improved method and system for data processing in general and, in particular, to an improved method and system for data compression. Still more particularly, the present invention relates to an improved method and system for compressing a set of compiled microcode to be executed within a data processing system.

2. Description of the Prior Art

A monolithic embedded data processing system typically comprises three major components, namely, a central processing unit, a non-volatile memory, and a random access memory. A sequence of executable microcode, commonly known as firmware, intended for a specific application may be stored within the non-volatile memory. During operation, this sequence of executable microcode is then loaded from the non-volatile memory to the central processing unit for subsequent execution. The random access memory can be utilized for storing data or may serve as a cache memory for instructions.

Because of their high-performance, low-power consumption, and relatively small silicon-area requirement, RISC (reduced instruction set computer) architecture microprocessors and microcontrollers are becoming a preferred choice as the central processing unit for monolithic embedded data processing systems over their CISC (complex instruction set computer) counterparts. However, even though RISC microprocessors and micro-controllers are smaller and have lower power consumption, particularly at the more moderate performance levels, most RISC microprocessors and micro-controllers require a larger amount of code to perform any given task as compared to CISC processors. Depending on the architecture of the microprocessor and the embedded data processing system application, a RISC microcode module is typically 20% to 50% larger than an equivalent CISC microcode module. This translates to a higher memory cost, because additional non-volatile memory must be utilized to store the microcode. Incidentally, this will result in an overall larger chip which translates to an overall higher system cost.

Consequently, it would be desirable to provide an improved method and system to compress a set of microcode to be utilized within an embedded data processing system such that the memory requirement for microcode storage can be reduced.

SUMMARY OF THE INVENTION

In view of the foregoing, it is therefore an object of the present invention to provide an improved method and system for data processing.

It is another object of the present invention to provide an improved method and system for compressing data.

It is yet another object of the present invention to provide an improved method and system for compressing a set of compiled microcode to be utilized within a data processing system.

In accordance with the method and system of the present invention, a set of compiled microcode is parsed into multiple microcode segments, wherein each of these microcode segments is of equal length. Each of the microcode segments is then individually compressed by utilizing a data-compression routine. Next, all of these compressed microcode segments are concatenated to yield a set of compressed executable microcode. Finally, the starting address for each of the compressed microcode segments is stored in an indexer. By so doing, the required memory for storing the compressed executable microcode is reduced.

All objects, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DESCRIPTION OF A PREFERRED EMBODIMENT

In the following description, numerous specific details are set forth, such as device types, number of bits, etc., in order to provide a thorough understanding of the present invention. However it will be obvious to those skilled in the art that the present invention may be practiced without these specific details. On the contrary, various well-known elements are not shown or described in detail in order to avoid any unnecessary obscuring of the present invention.

Figure 1:
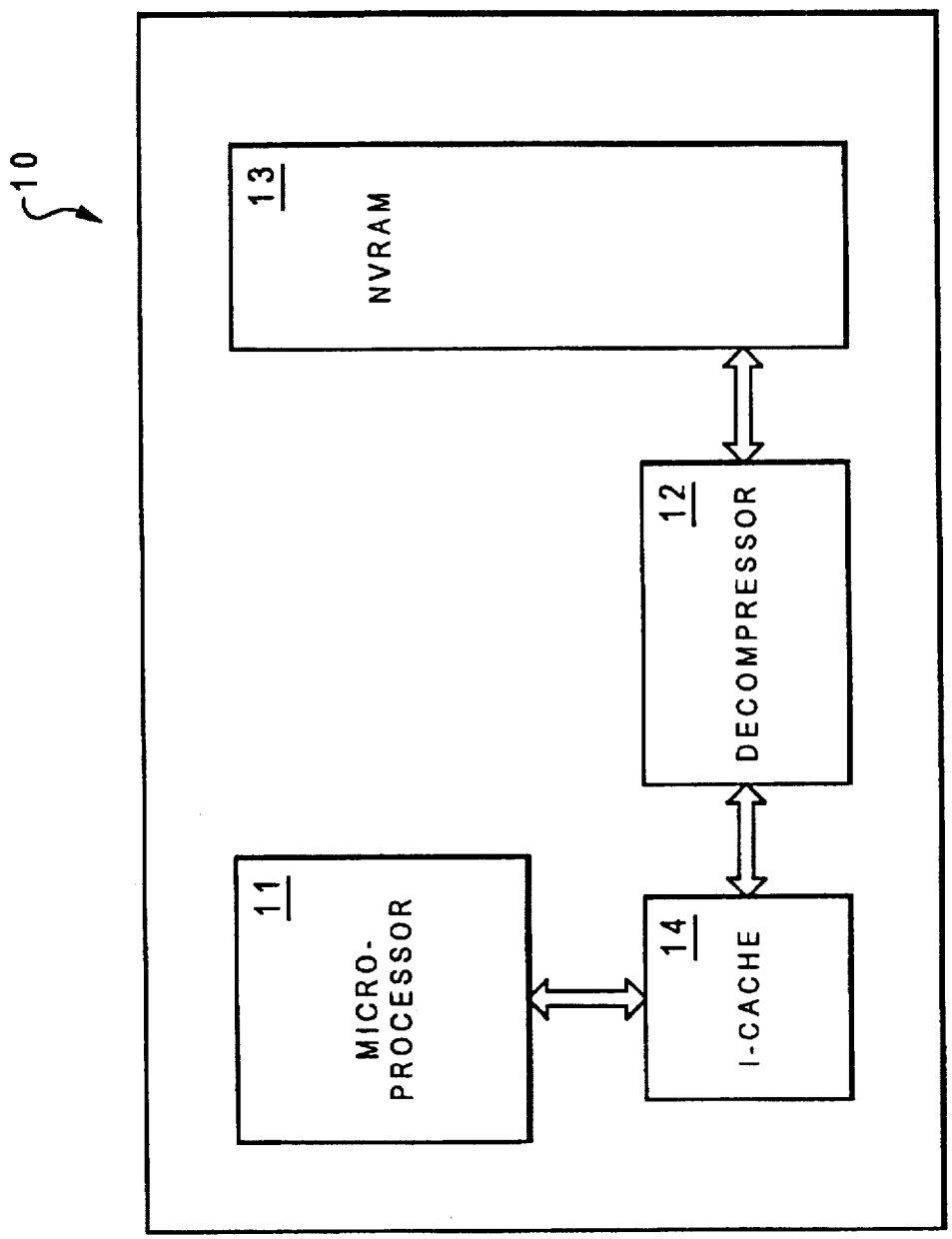
FIG. 1 is a block diagram of a monolithic embedded data processing system having a data decompression circuit, in which the present invention may be implemented.

Referring now to the drawings and in particular to FIG. 1, there is illustrated a block diagram of a monolithic data processing system having a data decompression circuit, in which the present invention may be applicable. As shown, monolithic data processing system 10 comprises a microprocessor (or microcontroller) 11, a decompressor 12, a non-volatile random access memory (NVRAM) 13, and an instruction cache memory (I-cache) 14. Decompressor 12 is coupled between NVRAM 13 and I-cache 14. In addition, I-cache 14 is coupled to microprocessor 11 in which a cache manger (not shown) for I-cache 14 may be incorporated. NVRAM 13 may be a read only memory (ROM).

Depending on the specific application, I-cache 14 is approximately 1 KByte to 2 KBytes in size. Each cache line within I-cache 14 is preferably 16 words long, which coincides with the size of a logical segment (or logical block) within NVRAM 13. After a cache "miss," which typically occurs when an instruction branches to a logical segment that is not within I-cache 14, a linefill operation will be performed by obtaining a microcode segment from NVRAM 13 to replace a cache line within I-cache 14.

Compression of microcode

Figure 2:
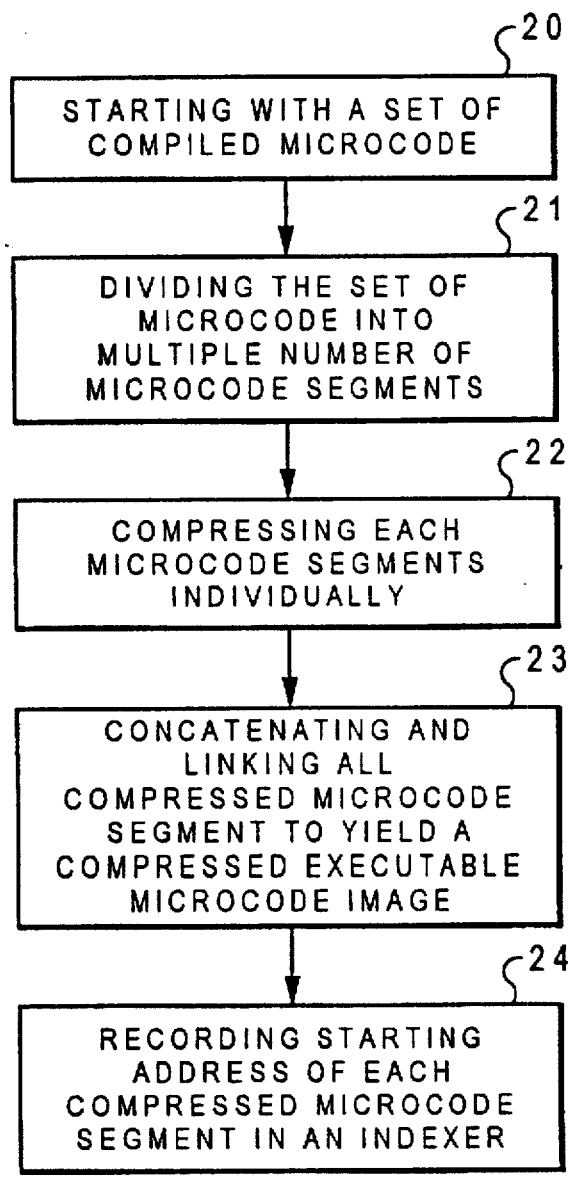
FIG. 2 is a high-level logic flow diagram of a method for compressing a set of microcode to be utilized within the embedded data processing system of FIG. 1, in accordance with a preferred embodiment of the invention.

With reference now to FIG. 2, there is illustrated a high-level logic flow diagram of a method for compressing a set of microcode to be utilized within the monolithic data processing system of FIG. 1, in accordance with a preferred embodiment of the invention. The method begins with a set of compiled microcode (or object microcode), as depicted in block 20. A standard compiler may be utilized to yield such a set of compiled microcode from a set of source microcode. Then, the set of compiled microcode is divided into a multiple number of microcode segments, as shown in block 21. As a preferred embodiment of the invention, each microcode segment is 16 words long, which is also the size of a cache line within I-cache 14. Subsequently, each of these microcode segment is individually compressed by utilizing a data-compressing routine, as illustrated in block 22. Theoretically, any data compression algorithm should suffice for this purpose; however, it is preferable to utilize a compression algorithm that is amenable to high-speed hardware implementation in a small silicon area while still able to achieve a sufficiently good compression ratio. After completion of the compressions, all the individual compressed microcode segments are concatenated and linked together to yield a compressed executable microcode image, as shown in block 23. Finally, the starting address of each compressed microcode segment is recorded in an indexer, as depicted in block 24. As a preferred embodiment of the invention, the indexer may be stored within NVRAM 13.

As part of the implementation, this compressed executable microcode image will be preloaded within NVRAM 13. During operation, the compressed microcode is subsequently translated back to its original form via decompressor 12 before the microcode is sent to I-cache 14 for storage and microprocessor 11 for execution. The basic principle employed by the monolithic data-processing system of FIG. 1 is to decompress the compressed microcode stored in the NVRAM as needed and to execute it concurrently as the instructions emerge from the decompressor.

Figure 3:
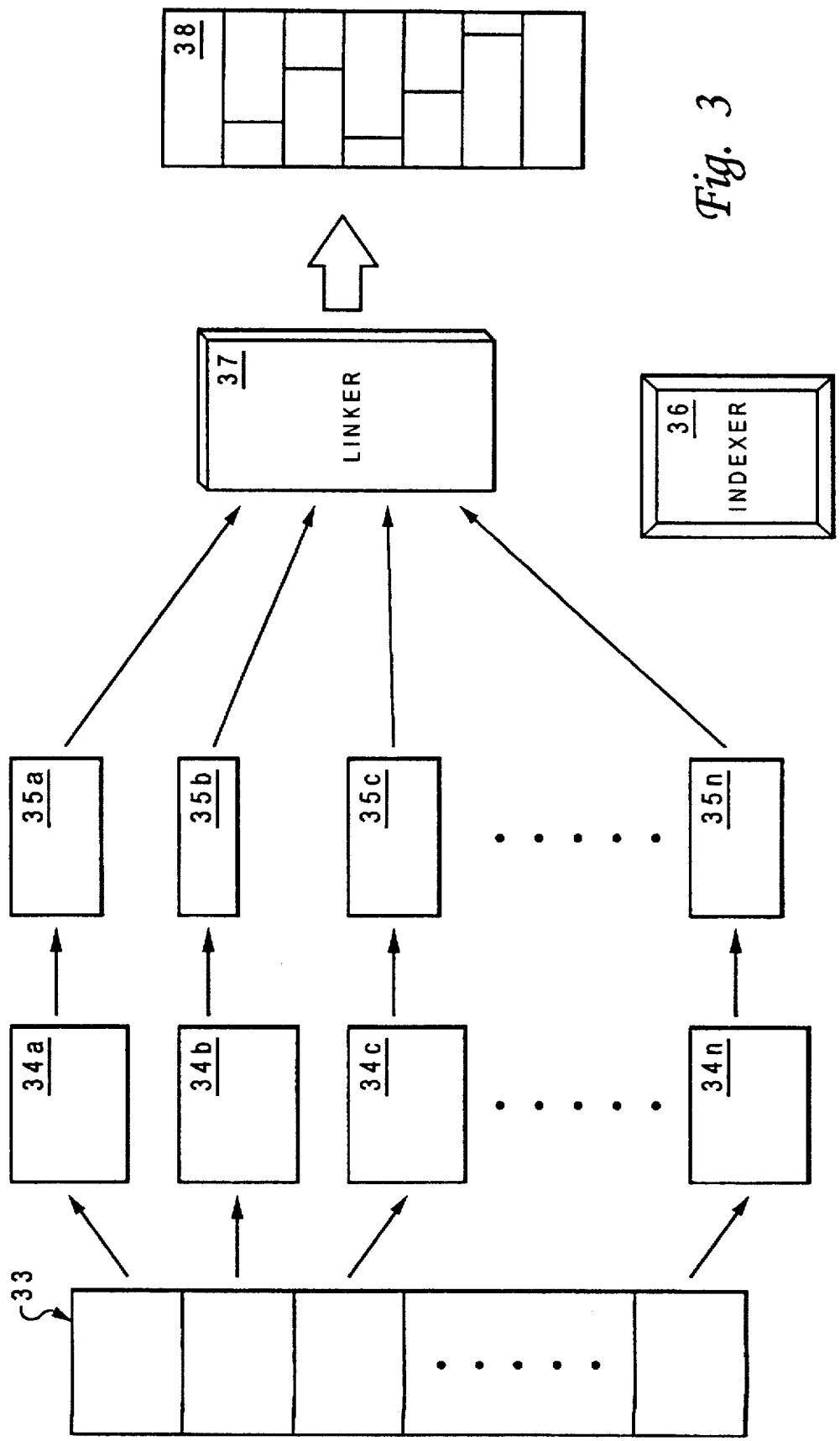
FIG. 3 is a graphical depiction of the method for compressing a set of microcode as described in FIG. 2.

Referring now to FIG. 3, there is a graphical depiction of the method for compressing a set of microcode as described in FIG. 2. As shown, compiled microcode 33 is first parsed into multiple microcode segments 34a, 34b, 34c, and 34n, each microcode segment having the same length as a cache line within the I-cache. Subsequently, each of microcode segments 34a–34n is compressed individually by utilizing a preferred data-compressing routine as discussed above. Each compressed microcode segments 35a–35n may have a size different from each others. All compressed microcode segments 35a–35n are then concatenated and linked by linker 37 in order to produce a set of compressed executable microcode 38. Finally, an indexer 36 is utilized to keep track of the starting address of each compressed microcode segment within compressed executable microcode 38. Not surprisingly, there are several discrete concepts associated with the construction of the indexer under the present invention, and these concepts are discussed in the following sections.

Compressed data-indexing resolution

The issue of compressed data-indexing resolution affects the design of the indexer, the choice of the data compression algorithm, and the utilization efficiency of the data storage space, i.e., the NVRAM.

If an indexer is capable of addressing down to a "bit" level, data storage space will be utilized to its maximum efficiency because there is no wasted bit between the end of one compressed microcode segment and the start of the next. However, the indexing information for the starting address of each of the compressed microcode segments is longer and more index storage space is required.

Now, suppose an indexer capable only of addressing down to a "byte" level (8 bits) is implemented. Then, each compressed microcode segment must start at a "byte" boundary, and the indexer needs to provide three bits less information per segment, compared to "bit" level addressing. However, if the data compression algorithm is efficient, the variable length encoded data is still going to vary down to the "bit" level. Thus, on the average, half a byte, or 4 bits, of the data storage space will be wasted per segment.

An indexing to a "hex digit" level (4 bits) requires one more addressing bit per segment, but results in two bits less being wasted. However, if an addressing scheme resolving down to two bits is utilized, data storage saving is only one bit per segment on the average, and this offers no improvement over the "hex digit" level, because one more addressing bit is required.

In summary, it appears that an indexer having an indexing scheme to the "hex digit" level is optimal from a data storage standpoint, at least for efficient compression algorithms. Assuming the data storage space is a conventionally organized array of 8-, 16-, 32- or 64-bit words, the task of properly aligning the microcode segment to feed to the decompressor is also much easier and requires fewer circuits for the "hex digit" level alignment than the "bit" level alignment. This is yet another advantage for the "hex digit" level addressing scheme. Therefore, "hex digit" level addressing is a preferred segment indexing scheme for the present invention.

Multiple segment entries per index word

One way of reducing the indexing overhead per microcode segment is to have more than one segment entry per index word. Especially in certain applications where microcode segments are quite small, it is advantageous to consider a scheme in which a base address is coded in part of the index word, and a displacement is utilized to generate the address(es) of the next segment(s).

Figure 4:
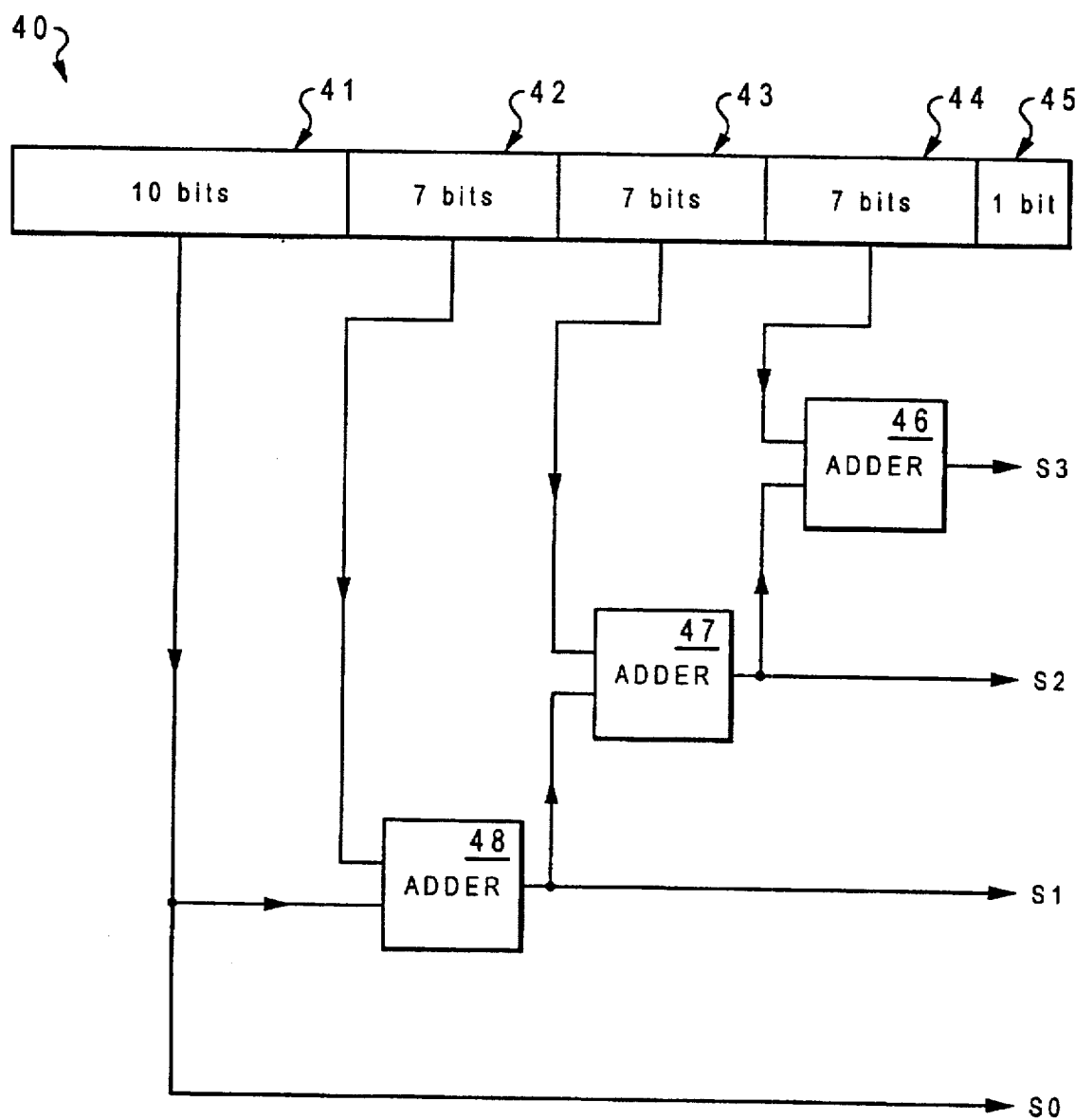
FIG. 4 is a block diagram illustrating an addressing scheme in accordance with a preferred embodiment of the invention.

With reference now to FIG. 4, there is illustrated a block diagram of a scheme in which a base address is encoded in part of the index word, according to a preferred embodiment of the invention. As shown, index word 40 is divided into five fields 41, 42, 43, 44, and 45, each field having a width of 10 bits, 7 bits, 7 bits, 7 bits, and 1 bit, respectively. Field 41 is the "hex digit" address of, for example, segment S0, fields 42–44 are displacements that may be added to field 41 in order to yield the addresses of segment S1, segment S2, and segment S3.

If the value of any of fields 42–44 is a zero, it is interpreted as a displacement of 128 digits because no compressed segment can occupy zero space. The zero in any of fields 42–44 may also be utilized to indicate to the decompressor that a preceding segment is held in an uncompressed form because a particular data block is reduced in size by only a very small amount, or did not compress at all.

The last segment of index word 40, segment S3 in this example, does not require an entire 7-bit field, as its starting address is all that is needed by the decoding hardware. The rest of the information can be derived from the preceding fields, and so it is only necessary to utilize a single bit to indicate to the decompressor whether or not segment S3 is held in compressed form.

In addition, the indexing word structure is shown together with an example of the decoding hardware utilized to derive the individual address values for each segment. Basically, the logical segment number (less the 2 low-order bits), is utilized as an address to reference index word 40. Adder circuits 46–48 then derive addresses for S1, S2, and S3, the low-order two logical segment number bits being utilized to select the final address.

Based on the assumption that the average compression ratio is about 2:1, a 64-Byte logical segment will typically require 32 bytes of data storage. The 32-bit index word in this example references 4 segments; thus the average cost is 8 bits per segment, which amounts to an overhead of 3.1% per segment. If a data compression algorithm that only encodes output in "hex digits" is employed, this is the total additional overhead required. If an algorithm which encodes down to the "bit" level is utilized, there will be two more bits per segment wasted, on the average, in the data storage space, as each segment must begin on a "hex digit" boundary. Thus, the total overhead now becomes ten bits per segment or, on the average, 3.9% at a 2:1 compression.

This is an acceptably low overhead for indexing, though the total data storage space that can be addressed by this scheme is rather small. Only ten bits of absolute addressing are available as a base index. Because this is a "hex digit" address, only 512 bytes of physical data storage can be accessed, or a total of 16×64 KByte logical segments, at a 2:1 compression ratio. There are five different techniques that can be utilized to improve this situation and they are described in the following sections. These techniques may be utilized separately or in any combination, depending on the specific application.

1. Separate index memory and non-byte memory widths

If the indexer is designed to be a separate entity, the width of the indexer need not be dictated by the width of the NVRAM, and can be of any size in order to suit the overall storage capacity implemented on the system. As an example, a system having a 64-KByte physical data storage array may have a separate index array of 39 bits wide, arranged in a 17.7.7.7.1 indexing format. The first 17-bit field will allow addressing anywhere to a "hex digit" resolution, and the other 7-bit fields generate starting addresses for the other three segments in the word.

The total number of index words needed depends on the data compression expected to be achieved. At an average compression ratio of 2:1, there would be 2048×64-Byte logical segments of data stored in the 64 KBytes of physical data storage space, and this would require 512 index words at four entries per word.

A related approach is to make both the indexer and the NVRAM as a part of the same contiguous array structure. Because microcode is going to be extracted from the data storage space and fed to the decompressor anyway, there is no compelling need for the width of the NVRAM to be limited to multiples of 4 bits, if "hex digit" addressing is utilized. Thus, 36-bit or 40-bit word width may be employed, utilizing a 14.7.7.7.1 or 18.7.7.7.1 indexing format to reference an 8- or 128-KByte physical data storage array, respectively. Note that although a more practical size of storage array can now be addressed, the indexing overhead per segment is also larger, about 4.7% for a 40-bit word structure instead of 3.9% for a 32-bit word structure mentioned previously.

2. More segments per index word

Having more segments per index word can improve matters considerably. For example, if each index word were 64 bits wide, a 21.7.7.7.7.7.7.1 indexing format becomes possible. This allows $2^{21}$ "hex digits" of physical addressing, or 1 MByte, now with eight logical blocks per index word. The overhead for this indexing scheme is still 3.9%, which is the same as in the 32-bit example.

The major disadvantage of this approach is that extra dataflow circuits are needed for selecting and aligning data as well as the longer logic path lengths and extra adder circuitry involved. The 64-bit index example requires seven separate adder circuits, compared to only three as required by a 32-bit index. Consequently, there may be an associated increase in the delay in determining an address of the last segment. Certainly, more parallel adder circuits may be utilized to alleviate this problem; however, this is also likely to take up a significant amount of silicon area.

3. Coarser base address resolution

The base address itself can be at a coarser resolution. For example, a system based on the 32-bit field structure as shown in FIG. 4 may utilize an addressing resolution of 16 bits for the displacement, instead of a "hex digit" resolution. This requires the compressed data for each group of four logical segments to be on a 16-bit word boundary, so that a physical storage space of up to 1024×16, or 2 KBytes, may be addressed.

Incidentally, there is an associated increase wastage in the data storage space if an algorithm capable of encoding to a single bit is utilized. On the average, two bits are wasted for the segments S0, S1, and S2, and 8 bits are wasted at the end of B3, as the next group of four segments must now start on a 16-bit boundary. The total overhead for the group of four segments is 32 bits for an index word, plus 14 bits wasted in the data storage space, or about 4.5% per segment at 2:1 compression ratio.

4. Multiple storage macros on-chip

Another way to increase available storage space is to replicate storage array macros on the system. Only one macro is enabled at a time, depending on the requested logical segment number, and the adder circuit arrangement shown in FIG. 4 can be common to all storage arrays.

The data held in different storage array macros may not be compressed to an identical amount, so it is desirable to allow different numbers of logical segments to be stored in each macro. One way this can be done is through a hardware circuit similar to that shown in FIG. 5.

Figure 5:
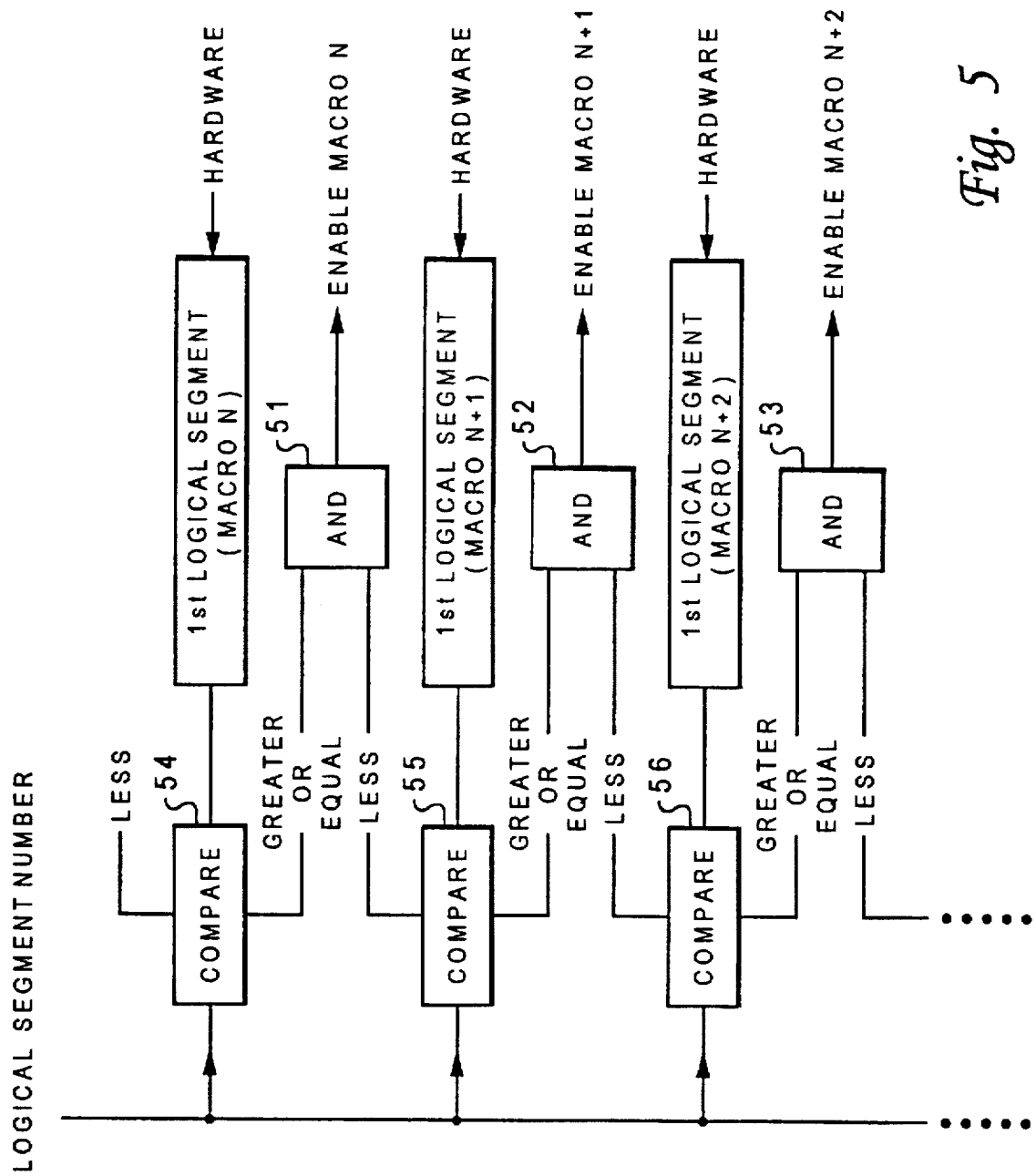
FIG. 5 is block diagram of a macro decoding scheme implementation in accordance with a preferred embodiment of the invention.

Referring now to FIG. 5, there is illustrated a block diagram of a macro decoding scheme in accordance with a preferred embodiment of the invention. Note that in this scheme, some space is wasted at the end of each data storage macro. As each index word relates to four logical segments, this is going to be two logical segments on the average, or 64 Bytes of physical space at 2:1 compression ratio.

A series of registers and comparators is provided, one for each of the storage macros, and a requested segment number is broadcast to all. Each comparator tests the requested segment number against a hardwired number representing the first segment in its associated storage array, and then outputs both a true and complement GREATER_OR_EQUAL signal. Each of AND gates 51–53, respectively associated with each of compare circuits 54–56, is able to then form an ENABLE signal, which is only active for one of the storage array macros.

It is simplest to store all the index words in one array, so a logical segment number can be utilized directly as an index address, then the fields from the index word are added and applied to the selected data storage array macro as a "hex digit" address, exactly as in FIG. 4.

In FIG. 5, a selection logic for only three macros is shown. The numbers hardwired into compare circuits 54–56 are determined when compression on the data is performed. The values can be set by a fuse-blowing method, or loaded to registers from reserved locations in one of the data storage arrays.

As noted earlier, this scheme wastes an additional 64 bytes of storage space, on the average, in each array macro. However, provided a sufficiently large number of logical segments is held in each macro, this need not be a significant disadvantage.

5. Optimal index displacement coding

In general, a fixed-size logical segment will not compress to the same size, but more importantly, the distribution of such sizes is far from uniform. This leads to the notion that the displacement fields need not be flat binary fields, because according to coding theory, the displacement fields would only be optimal for a uniform distribution, and this is not the case.

A preferred translation mapping for a 6-bit displacement scheme is given in Table I. Note that the displacement mapping is exact, for commonly occurring compressed logical segment sizes, so there is no more wastage there than with the 7-bit displacement field. For the less common sizes, there is in effect a falloff in the addressing resolution because not all of the original 128 code values can be translated. Some storage space will be wasted as a result, but the overall effect is less serious because the frequency with which these cases occur is smaller.

To take an extreme example, suppose there is data which, when compressed by the above-mentioned algorithm, turned out to always either compress exactly 2:1, or not at all. In such a case, a 1-bit displacement may be utilized, instead of 7-bits, without any penalty whatsoever. A simple arrangement may be made for the value 0 to translate to 128 hex digits, and 1 to translate to 64.

A look-up table translation process is attractive because it allows any value mapping to be readily implemented, and the optimal table depends on the data. For applications such as embedded systems microcode, data is likely to compress in much the same way. A standard translate table or a hardwired translator circuit may be utilized in place of a table, thereby saving some silicon area.

TABLE I

Typical displacement translation for a 6-bit field

| 6-bit field value | translated value |
| --- | --- |
| 0 | 128 (no compression) |
| 1–4 | 8, 18, 24, 32 (every 8) |
| 5–8 | 40, 42, 44, 46 (every 2) |
| 9–51 | 48, 49, . . . , 89, 90 (every 1) |
| 52–59 | 91, 93, . . . , 103, 105 (every 2) |
| 60–63 | 107, 111, 115, 119 (every 4) |

Alternatively, an optimal translate table could be determined for each unique data load and programmed into the chip along with the data. The individual data storage macros suggested previously could even utilize a separate table for each macro, if it were advantageous to do so.

Note, however, that the storage requirements for the translation table should not be overlooked. The 6-bit translation table is 64 data words of 7 bits wide, and saves 3 bits per index word. Therefore, unless the index is significantly larger than 64×7/3 words, it would be better to simply utilize a wider index word, if this can be arranged. This is the case if less than 512 logical segments are stored; otherwise, it is best to utilize a hardwired translator circuit.

A preferred storage macro design

A preferred embodiment of a NVRAM storage macro is to utilize a 36-bit wide NVRAM storage array for the index, with a 17.6.6.6.1 indexing format. HEX DIGIT data address values are utilized so the DMA circuitry includes paths which allow data from any 4-bit boundary in the data array to be aligned and fed into the decompressor hardware. The data storage array word must be a binary multiple of 4 bits having a suggested width of 32 bits.

At a compression ratio of 2:1, the arrangement as mentioned above permits a physical data storage size of 64 KBytes, or about 2048×64 byte logical segments of data storage. The size of the index array is not fixed, but for code storage applications, a size of 512 words is preferred. The total overhead in this scheme is 11 bits per data segment (9 bits utilized in the index array and 2 bits, on the average, wasted in the data array) or about 4.3%.

As has been described, the present invention provides an improved method and system for compressing a set of compiled microcode to be utilized within an embedded data processing system. Under the present invention, the set of compiled microcode is split into several equal-size microcode segments, and each of these microcode segments is compressed individually and separately to allow subsequent random access.

A variety of techniques are suggested, which can be utilized singly or in combination, to reduce the indexing overhead problem that occurs when a large number of small microcode segments is to be stored in their compressed form for random access. Overall storage capacities of the macros are adequate to cover a range suitable for embedded systems NVRAM storage applications, and a method that allows larger storage sizes to be accommodated by utilizing multiple macros on a single chip is also disclosed. On the average, the performance of such compressed NVRAM storage is faster than the comparable non-compressed implementations, depending on the width of the storage arrays utilized and the data compression ratio obtained.

While the invention has been particularly shown and described with reference to a preferred embodiment, it will be understood by those skilled in the art that various changes in form and detail may be made therein without departing from the spirit and scope of the invention.

What is claimed is:

1. A method for compressing a set of compiled microcode to be utilized within a data processing system, said method comprising the steps of:

parsing a set of compiled microcode into a plurality of microcode segments, wherein each of said plurality of microcode segments is of equal length;

compressing each of said plurality of microcode segments by utilizing a data-compression routine;

concatenating all of said plurality of compressed microcode segments to yield a set of compressed executable microcode; and providing an index for each of said plurality of microcode segments.

2. The method for compressing a set of microcode to be utilized within a data processing system according to claim 1, wherein said providing an index step is performed by an indexer.

3. The method for compressing a set of microcode to be utilized within a data processing system according to claim 1, wherein said providing an index step further includes a step of providing an index by utilizing a hex digit indexing scheme.

4. The method for compressing a set of microcode to be utilized within a data processing system according to claim 1, wherein said providing an index step further includes a step providing an index for indexing more than one of said plurality of microcode segments.

5. A monolithic data processing system for processing a set of microcode, wherein said monolithic data processing system comprising:

a non-volatile memory having a set of compressed executable microcode;

a decompressor coupled to said non-volatile memory for performing decompression of said set of compressed executable microcode;

an instruction cache memory coupled to said decompressor for receiving said decompressed microcode from said decompressor, wherein said decompressed microcode is a subset of said set of compressed executable microcode stored in said non-volatile memory; and a central processor coupled to said instruction cache memory for executing said decompressed microcode from said instruction cache memory.

6. The monolithic data processing system according to claim 5, wherein said monolithic data processing system further includes an indexer.

7. The monolithic data processing system according to claim 6, wherein said compressed executable microcode is obtained by compressing a set of executable microcode in a segment basis, wherein each microcode segment is of equal length.

8. The monolithic data processing system according to claim 6, wherein said indexer is implemented within said non-volatile memory.

9. The monolithic data processing system according to claim 6, wherein said indexer utilizes a hex digit indexing scheme.

10. The monolithic data processing system according to claim 7, wherein said indexer further includes an index word for indexing more than one said microcode segment.

* * * * *